United States Patent
Saeedi et al.

(10) Patent No.: US 9,935,719 B1
(45) Date of Patent: Apr. 3, 2018

(54) BURST-MODE OPTICAL RECEIVER WITH FEED-FORWARD DC-BIAS ACQUISITION AND FLASH-OVERSAMPLING CLOCK RECOVERY

(71) Applicant: Oracle International Corporation, Redwood Shores, CA (US)

(72) Inventors: Saman Saeedi, Redwood City, CA (US); Frankie Y. Liu, Palo Alto, CA (US); Suwen Yang, Mountain View, CA (US)

(73) Assignee: Oracle International Corporation, Redwood Shores, CA (US)

( * ) Notice: Subject to any disclaimer, the term of this patent is extended or adjusted under 35 U.S.C. 154(b) by 0 days.

(21) Appl. No.: 15/462,306

(22) Filed: Mar. 17, 2017

(51) Int. Cl.
*H04B 10/00* (2013.01)
*H04B 10/61* (2013.01)
*H04L 7/033* (2006.01)
*H04L 7/00* (2006.01)
*H04J 14/00* (2006.01)

(52) U.S. Cl.
CPC ....... *H04B 10/6164* (2013.01); *H04L 7/0087* (2013.01); *H04L 7/0331* (2013.01)

(58) Field of Classification Search
CPC ........ H04B 10/60; H04B 10/66; H04B 10/69; H04B 10/695
See application file for complete search history.

(56) References Cited

U.S. PATENT DOCUMENTS

| 2005/0232637 A1* | 10/2005 | Paillet | H04B 10/66 398/140 |
|---|---|---|---|
| 2005/0281565 A1* | 12/2005 | Duanmu | H04B 10/695 398/214 |

\* cited by examiner

*Primary Examiner* — Daniel Dobson
(74) *Attorney, Agent, or Firm* — Park, Vaughan, Fleming & Dowler LLP

(57) ABSTRACT

An optical receiver receives a photocurrent from a photosensor and uses a transimpedance element to convert the photocurrent into an input signal. Next, an amplifier amplifies the input signal to produce an amplified input signal. At the same time, a clock-recovery circuit generates a clock signal, which is used to clock the amplified input signal to produce a receiver output. During an initial-calibration operation, the clock-recovery circuit phase-aligns a locally generated reference signal with transitions in the amplified input voltage signal to produce the clock signal by: feeding the reference signal through a delay-locked loop to produce a set of equally spaced phases; using the set of equally spaced phases to sample a preamble in the amplified input voltage signal to detect a crossing point; choosing a corresponding phase from the set of equally spaced phases based on the crossing point; and using the chosen phase to produce the clock signal.

20 Claims, 8 Drawing Sheets

BURST-MODE OPTICAL RECEIVER WITH FEED-FORWARD DC-BIAS ACQUISITION AND FLASH-OVERSAMPLING CLOCK RECOVERY

BACKGROUND

Field

The disclosed embodiments relate to the design of an optical receiver. More specifically, the disclosed embodiments relate to the design of a burst-mode optical receiver, which uses a feed-forward circuit to acquire a DC-bias signal level and uses flash-oversampling for clock recovery.

Related Art

Silicon photonics is a promising technology that can potentially provide large communication bandwidth, low latency and low power consumption for inter-chip and intra-chip communications within data centers. In order to achieve such low-latency, high-bandwidth optical connectivity, a variety of optical components need to be developed, including optical receivers.

Also, data centers presently consume large amounts of power. In order to reduce this power consumption, there is presently a push to transition to "energy-proportional" communication links, which can be turned off to save power when there is no data to transmit. In order to make such energy-proportional communication links practical, "burst-mode" optical receivers need to be developed, which are able to rapidly turn on and off.

Unfortunately, existing burst-mode optical receivers require a significant amount of time to initially acquire DC-bias signal levels when they are turned on. They also require a significant amount of time to perform associated clock-recovery operations to extract a clock signal, which is used to obtain data from a received optical signal.

Hence, what is needed is a new optical receiver design, which is able to rapidly extract an embedded DC-bias signal level and perform associated clock-recovery operations.

SUMMARY

The disclosed embodiments relate to the design of an optical receiver. This optical receiver has an input that receives a photocurrent from a photosensor and a transimpedance element, which converts the photocurrent into an input voltage signal. Next, a receiver amplifier amplifies the input voltage signal to produce an amplified voltage signal. At the same time, a clock-recovery circuit generates a clock signal, which is used to clock the amplified input voltage signal to produce a receiver output. During an initial-calibration operation, the clock-recovery circuit phase-aligns a locally generated reference signal with transitions in the amplified input voltage signal to produce the clock signal. This phase-alignment process involves feeding the reference signal through a delay-locked loop (DLL) to produce a set of equally spaced phases, and then using the set of equally spaced phases to sample a preamble in the amplified input voltage signal to detect a crossing point. Next, a corresponding phase is chosen from the set of equally spaced phases based on the detected crossing point, wherein the chosen phase is used to produce the clock signal.

In some embodiments, the optical receiver uses a reference-signal-generation circuit to generate the reference signal, wherein the reference-signal-generation circuit comprises: a local oscillator that generates a reference frequency; and a phase-locked loop (PLL) that uses the reference frequency to generate the reference signal.

In some embodiments, the clock-recovery circuit additionally includes a bang-bang clock-and-data-recovery (CDR) circuit. In these embodiments, after the initial-calibration operation completes and the chosen phase is locked, the clock-recovery circuit switches to using the bang-bang CDR to compensate for subsequent frequency drift.

In variations on these embodiments, the bang-bang CDR circuit shares a number of components with the PLL, including a charge pump, a loop filter and a capacitor.

In some embodiments, the preamble comprises a periodic signal that cycles between high and low signal levels, and while sampling the preamble, the clock-recovery circuit uses the set of equally spaced phases to sample half a cycle of the preamble to detect the crossing point.

In some embodiments, the clock signal comprises a pair of complementary clock signals, which are used to clock a corresponding pair of sense amplifiers, which sample the amplified input voltage signal on alternating clock edges, so that data is gathered at twice the frequency of the clock signal.

In some embodiments, the DLL includes a voltage-controlled variable delay line comprising a chain of delay elements that generates the set of equally spaced phases.

In some embodiments, the optical receiver includes a set of comparators that receive the amplified input voltage signal, wherein while sampling the preamble, the set of comparators is clocked by the set of equally spaced phases.

In some embodiments, the transimpedance element comprises one of: a resistor; and a transimpedance amplifier (TIA).

In some embodiments, the photosensor comprises a photodiode that converts an optical signal into the photocurrent.

DETAILED DESCRIPTION

Figure 1:
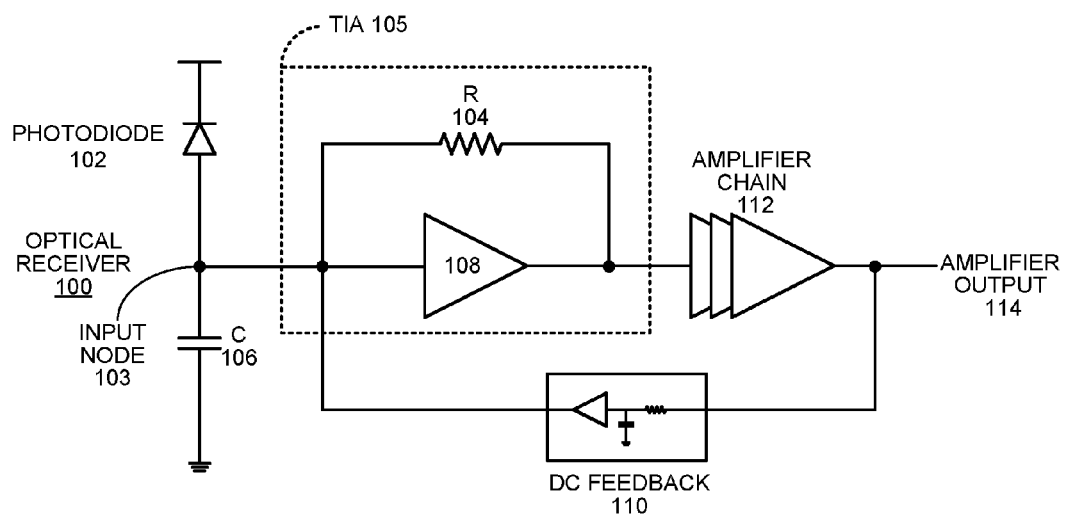
FIG. 1 illustrates an optical receiver with a transimpedance amplifier and conventional feedback DC acquisition.

The following description is presented to enable any person skilled in the art to make and use the present embodiments, and is provided in the context of a particular application and its requirements. Various modifications to the disclosed embodiments will be readily apparent to those skilled in the art, and the general principles defined herein may be applied to other embodiments and applications without departing from the spirit and scope of the present embodiments. Thus, the present embodiments are not limited to the embodiments shown, but are to be accorded the widest scope consistent with the principles and features disclosed herein.

The data structures and code described in this detailed description are typically stored on a computer-readable storage medium, which may be any device or medium that can store code and/or data for use by a computer system. The computer-readable storage medium includes, but is not limited to, volatile memory, non-volatile memory, magnetic and optical storage devices such as disk drives, magnetic tape, CDs (compact discs), DVDs (digital versatile discs or digital video discs), or other media capable of storing computer-readable media now known or later developed.

The methods and processes described in the detailed description section can be embodied as code and/or data, which can be stored in a computer-readable storage medium as described above. When a computer system reads and executes the code and/or data stored on the computer-readable storage medium, the computer system performs the methods and processes embodied as data structures and code and stored within the computer-readable storage medium. Furthermore, the methods and processes described below can be included in hardware modules. For example, the hardware modules can include, but are not limited to, application-specific integrated circuit (ASIC) chips, field-programmable gate arrays (FPGAs), and other programmable-logic devices now known or later developed. When the hardware modules are activated, the hardware modules perform the methods and processes included within the hardware modules.

Various modifications to the disclosed embodiments will be readily apparent to those skilled in the art, and the general principles defined herein may be applied to other embodiments and applications without departing from the spirit and scope of the present invention. Thus, the present invention is not limited to the embodiments shown, but is to be accorded the widest scope consistent with the principles and features disclosed herein.

Implementation Details

As mentioned above, there is presently a push to transition data centers to "energy-proportional" communication links, which can be turned off to save power when there is no data to transmit. However, to make such energy-proportional communication links practical, we need to develop components that can rapidly turn on to minimize delays for communications across the links. To further this goal, it is desirable to minimize the amount of time it takes an optical receiver to acquire a DC-bias reference signal and to perform associated clock-recovery operations. In an optical switch, an incoming optical signal can come from different lasers, and the average power of each laser may be different. So, an optical receiver needs to be able to quickly adjust its DC bias to account for these differences in average power.

Conventional optical receivers commonly use a current-to-voltage converter known as a transimpedance amplifier (TIA) to convert a photocurrent into a corresponding voltage signal. For example, FIG. 1 illustrates a conventional optical receiver 100, which receives an optical signal from a photodiode 102 at an input node 103, wherein input node 103 has input capacitance C 106 that arises from a parasitic capacitance and a junction capacitor of photodiode 102. This input capacitance C 106 sees the input resistance of TIA 105, which comprises a feedback resistance R 104 and an amplifier 108. The output of TIA 105 feeds into an amplifier chain 112, which amplifies a voltage signal from the output of TIA 105 to produce an amplifier output 114. There is also a feedback loop from amplifier output 114 back to input node 103 through an intervening DC feedback circuit 110 to adjust a DC bias for TIA 105.

The input resistance of optical receiver 100 is determined by the input resistance of TIA 105, which is simply the feedback resistance R 104 divided by A, wherein A is the gain of the amplifier 108. However, as technology continues to advance, the gain of such amplifiers is decreasing, although the bandwidth is becoming larger and the parasitic capacitances are becoming smaller. This reduction in gain makes the input resistance of TIA 105 higher. Note that the input resistance of optical receiver 100 times its input capacitance C 106 creates the dominant pole associated with the input node 103, and TIA 105 is used to decrease this input resistance to push this pole back. However, the above-described technological advances have caused the effectiveness of TIA 105 to decrease, which means that input node 103 is beginning to limit our bandwidth.

Fortunately, as packaging technologies continue to advance, input capacitance is becoming much smaller. In the past, typical optical receivers had 200 fF of input-node capacitance; now they have less than 20 fF. Consequently, we do not need a TIA as much as we needed it before. Instead, we can manage by simply connecting a passive resistor to the input node of an optical receiver to convert a photocurrent into a voltage. For example, see input resistor R 204, which is coupled to the input of optical receiver 200 as illustrated in FIG. 2.

Figure 2:
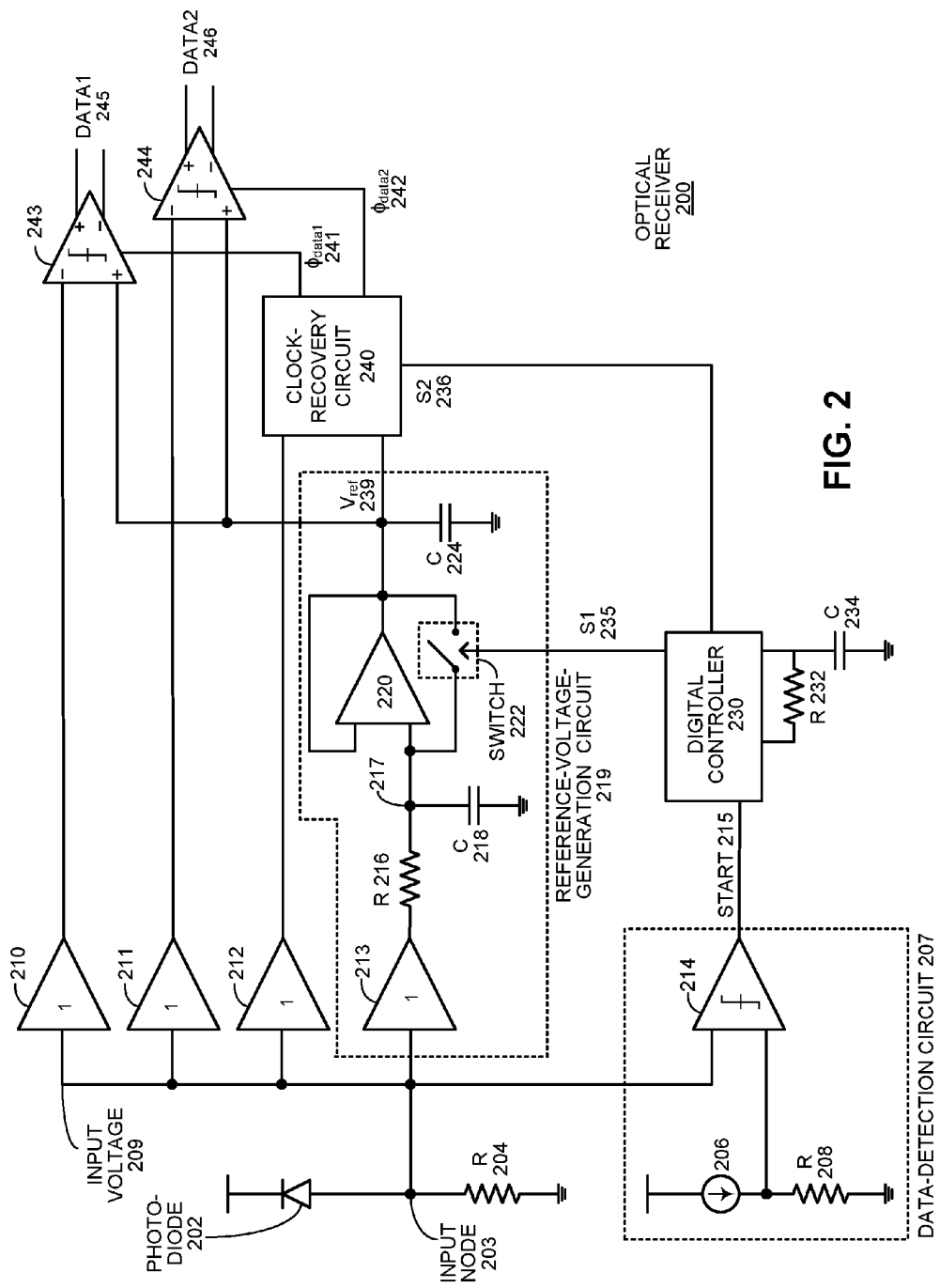
FIG. 2 illustrates a burst-mode optical receiver in accordance with the disclosed embodiments.

By doing away with a TIA that contains active gain circuitry, the optical receiver 200 illustrated in FIG. 2 provides a number of advantages. Note that the bias voltage for an amplifier in a TIA needs to be adjusted properly for the TIA to operate correctly. The conventional technique for adjusting this bias voltage involves using a feedback loop. However, a feedback loop has requirements regarding how fast it can be. If we make it too fast, the receiver starts to oscillate. If we make it too slow, the receiver may not be able to keep up with normal changes in bias voltage. So using a passive resistor instead of an active gain stage has the advantage of being less sensitive to changes in the bias point at the input node.

FIG. 2 illustrates a new design for an optical receiver 200, which does not use a TIA. This optical receiver 200 operates as follows. First, optical receiver 200 receives a photocurrent from a photodiode 202 at input node 203. This photocurrent feeds through an input resistor 204, which is coupled to ground, to create an input voltage 209 at input node 203. Input voltage 209 feeds through unity gain amplifiers 210 and 211 into the upper inputs of sense-amplifiers 243 and 244, respectively.

Optical receiver 200 also includes a clock-recovery circuit 240, which phase-aligns a locally generated reference signal with transitions in the input voltage 209 to produce a clock signal, which is used to clock the input voltage 209 to produce a receiver output. During operation, input voltage 209 from input node 203 feeds through a unity gain amplifier 212 into clock-recovery circuit 240, which produces a pair of complementary clock signals, $\varphi_{data1}$ 241 and $\varphi_{data2}$ 242 that are used to clock sense amplifiers 243-244, respectively. These complementary clock signals $\varphi_{data1}$ 241 and $\varphi_{data2}$ 242 cause sense amplifiers 243-244 to sample the input voltage 209 on alternating clock edges, so that data is gathered at twice the frequency of clock signals $\varphi_{data1}$ 241 and $\varphi_{data2}$ 242. Clock-recovery circuit 240 is described in more detail below with reference to FIGS. 3-6B.

Optical receiver 200 also includes a reference-voltage-generation circuit 219, which is structured as a feed-forward stage, and which generates a reference voltage $V_{ref}$ 239 that feeds into clock-recovery circuit 240 and into the lower inputs of sense amplifiers 243-244. Reference-voltage-generation circuit 219 includes an adjustable low-pass filter, including a filter resistor R 216 and two filter capacitors C 218 and C 224, which filters the input voltage received from input node 203 to produce $V_{ref}$ 239. More specifically, reference-voltage-generation circuit 219 feeds the input voltage received from input node 203 through a unity gain amplifier 213 and then through a filter resistor R 216, into intermediate-filter node 217. Intermediate filter node 217 is coupled through filter capacitor 218 to ground, and is also coupled to the lower input of filter amplifier 220. The top input of filter amplifier 220 is coupled to the output of filter amplifier 220, which is also coupled to ground through filter capacitor 224. The output of filter amplifier 220 produces $V_{ref}$ 239.

Reference-voltage-generation circuit 219 also includes a switch 222, which is coupled between the bottom input of filter amplifier 220 and the output of filter amplifier 220. Switch 222 is actuated by a control signal S1 235, which is generated by a digital controller 230. During operation, digital controller 230 receives a start signal 215 from a data-detection circuit 207, which detects data on the input voltage signal 209 by comparing the input voltage signal 209 against a threshold voltage generated by a current source 206 and a resistor 208. Digital controller 230 feeds this start signal 215 through a controller resistor 232 and a controller capacitor 234 to produce control signal S1 235 for reference-voltage-generation circuit 219. Digital controller 230 also generates another control signal S2 236, which feeds into clock-recovery circuit 240, and triggers clock-recovery circuit 240 to generate clock signals $\varphi_{data1}$ 241 and $\varphi_{data2}$ 242.

During a faster operating mode, which occurs when the data-detection circuit 207 does not detect any data on the input voltage signal, control signal S1 235 is not asserted. This causes switch 222 to remain open, which means that the output of filter amplifier 220 follows its input regardless of filter capacitor C 224; hence, filter capacitor C 224 does not affect the filtering process. In this case, the time constant $\tau_1$ for reference-voltage-generation circuit 219 is determined by filter resistor 216, which has a resistance R and filter capacitor 218, which has a capacitance $C_1$. Hence, the time constant $\tau_1=RC_1$, and the cutoff frequency $f_1$ for reference-voltage-generation circuit 219 is associated with $1/RC_1$.

In contrast, during a slower operating mode, which starts a bias-delay time $t_{BD}$ after data-detection circuit 207 detects data on the input voltage signal, and lasts until data-detection circuit 207 no longer detects data on the input voltage signal, control signal S1 235 is asserted. This causes switch 222 to close, which allows filter capacitor C 224 to affect the filtering process. In this case, the time constant $\tau_2$ for reference-voltage-generation circuit 219 is determined by filter resistor R 216, filter capacitor C 218 and filter capacitor C 224, which has a capacitance $C_2$. Hence, the time constant $\tau_2=R(C_1+C_2)$, and the cutoff frequency $f_2$ for reference-voltage-generation circuit 219 is associated with $1/R(C_1+C_2)$, which is slower than $f_1$.

It is advantageous to use a faster cutoff frequency $f_1$ for the low-pass filter in reference-voltage-generation circuit 219 during the preamble of a communication so that $V_{ref}$ 239 can rapidly converge to its steady state when the communication link is initially turned on and the signal levels are changing rapidly. However, this faster cutoff frequency $f_1$ can create dithering in $V_{ref}$ 239 when data bits are subsequently received. Note that incoming data, which is received after the preamble, is effectively a pseudo-random binary sequence (PRBS), which can contain a long sequence of ones or a long sequence of zeros, which can adversely affect the performance of optical receiver 200 by causing $V_{ref}$ 239 to drift up for a long sequence of ones, and down for a long sequence of zeros. Note that by using a balanced encoding scheme, we can ensure that a sequence of consecutive ones or a sequence of zeros has a maximum length. However, even with a balanced scheme, there may be 10 consecutive ones or zeros, and we need to hold the DC bias steady during those 10 bits. In this case, it advantageous to use the slower cutoff frequency $f_2$ to ensure that the DC bias will hold constant across long sequences of consecutive ones or zeros.

Note that filter amplifier 220 can be turned off when switch 222 is turned on, because closing switch 222 effectively eliminates the need for filter amplifier 220. There is typically a few millivolts of mismatch between the input and output of filter amplifier 220 when filter amplifier 220 is turned on, and it is undesirable to have this mismatch after the DC-bias voltage is stable. Turning off filter amplifier 220 can kill this mismatch.

Clock-Recovery Circuit

As mentioned above, clock-recovery circuit 240 phase-aligns a locally generated reference signal with transitions in input voltage 209 to produce a clock signal, which is used to clock input voltage 209 to produce a receiver output. When optical receiver 200 initially powers up, and after reference-voltage-generation circuit 219 stabilizes and is producing a stable $V_{ref}$ 239, clock-recovery circuit 240 performs a "flash-oversampling operation" to phase-align a locally generated reference signal with a preamble in an input data stream.

Figure 3:
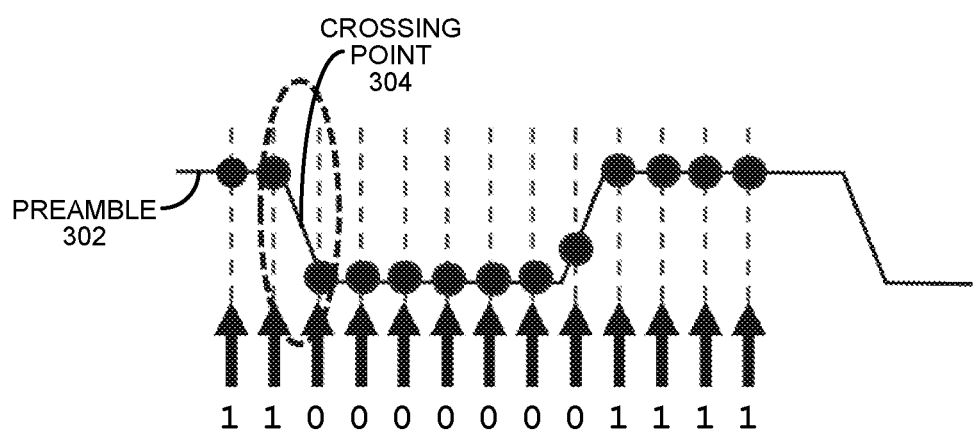
FIG. 3 presents a timing diagram illustrating the oversampling process in accordance with the disclosed embodiments.

Referring to FIG. 3, this flash-oversampling operation involves using a locally generated reference signal to produce a set of equally spaced phases, which appear in FIG. 3 as dashed lines. The system then uses the set of equally spaced phases to sample a preamble 302 in the input voltage signal to detect a crossing point 304. The system then chooses a corresponding phase from the set of equally spaced phases based on the detected crossing point 304, and then uses the corresponding phase to produce the clock signal.

Figure 4:
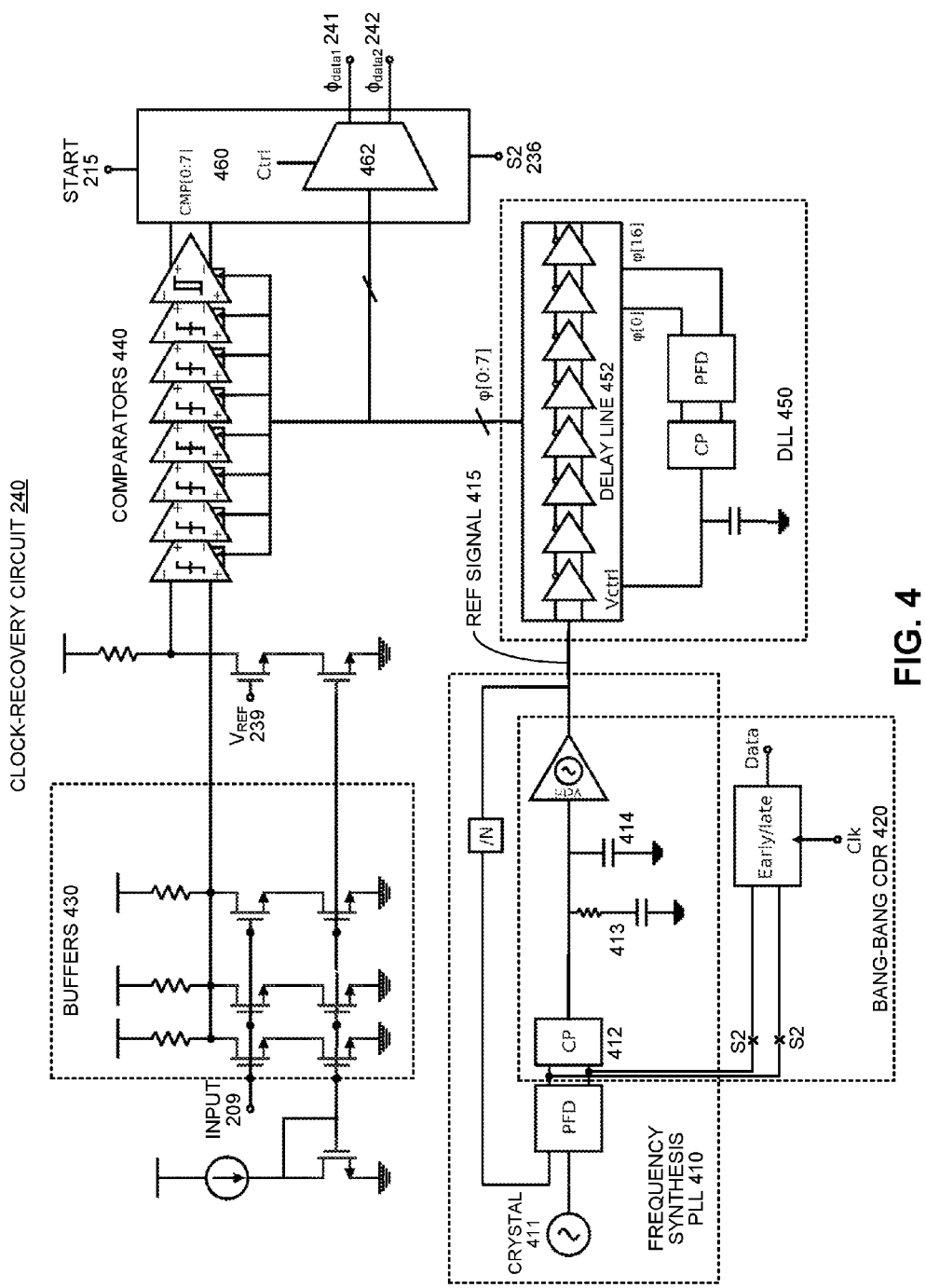
FIG. 4 illustrates a clock-recovery circuit in accordance with the disclosed embodiments.

Clock-recovery circuit 240 is illustrated in more detail in the schematic that appears in FIG. 4. As illustrated in FIG. 4, clock-recovery circuit 240 includes a frequency synthesis PLL 410, which receives a reference frequency from a local crystal oscillator 411 and uses this reference frequency to generation a reference signal 415. Reference signal 415 feeds into a delay-locked loop (DLL) 450, which includes a voltage-controlled variable delay line 452 comprising a chain of delay elements that generates a set of equally spaced phases $\varphi[0:7]$. This set of equally spaced phases $\varphi[0:7]$ feeds into a set of comparators 440, which are used to sample a preamble in the input voltage signal 209 to detect a crossing point. Note that input voltage signal 209 feeds through a set of buffers 430, which provide sufficient amplification to drive the set of comparators 440. The set of equally spaced phases is used to sample only a half cycle of the preamble to detect the crossing point. Note that it is not necessary to provide circuitry to sample an entire cycle because a half cycle is guaranteed to include a crossing point.

Next, a selection circuit 460 uses a multiplexer 462 to select a corresponding phase from the set of equally spaced phases based on the detected crossing point. The chosen phase is used to produce a clock signal, which comprises the pair of complementary clock signals $\varphi_{data1}$ 241 and $\varphi_{data2}$ 242, which are used to clock a corresponding pair of sense amplifiers 243 and 244 as illustrated in FIG. 2.

Clock-recovery circuit 240 additionally includes a bang-bang clock-and-data-recovery (CDR) circuit 420. After the initial-calibration operation completes and a chosen phase is locked by selection circuit 460, clock-recovery circuit 240 switches to using the bang-bang CDR circuit 420 to compensate for subsequent frequency drift. Note that bang-bang CDR circuit 420 shares a charge pump 412, a loop filter 413 and a capacitor 414 with frequency synthesis PLL 410.

Timing Diagram

Figure 5A:
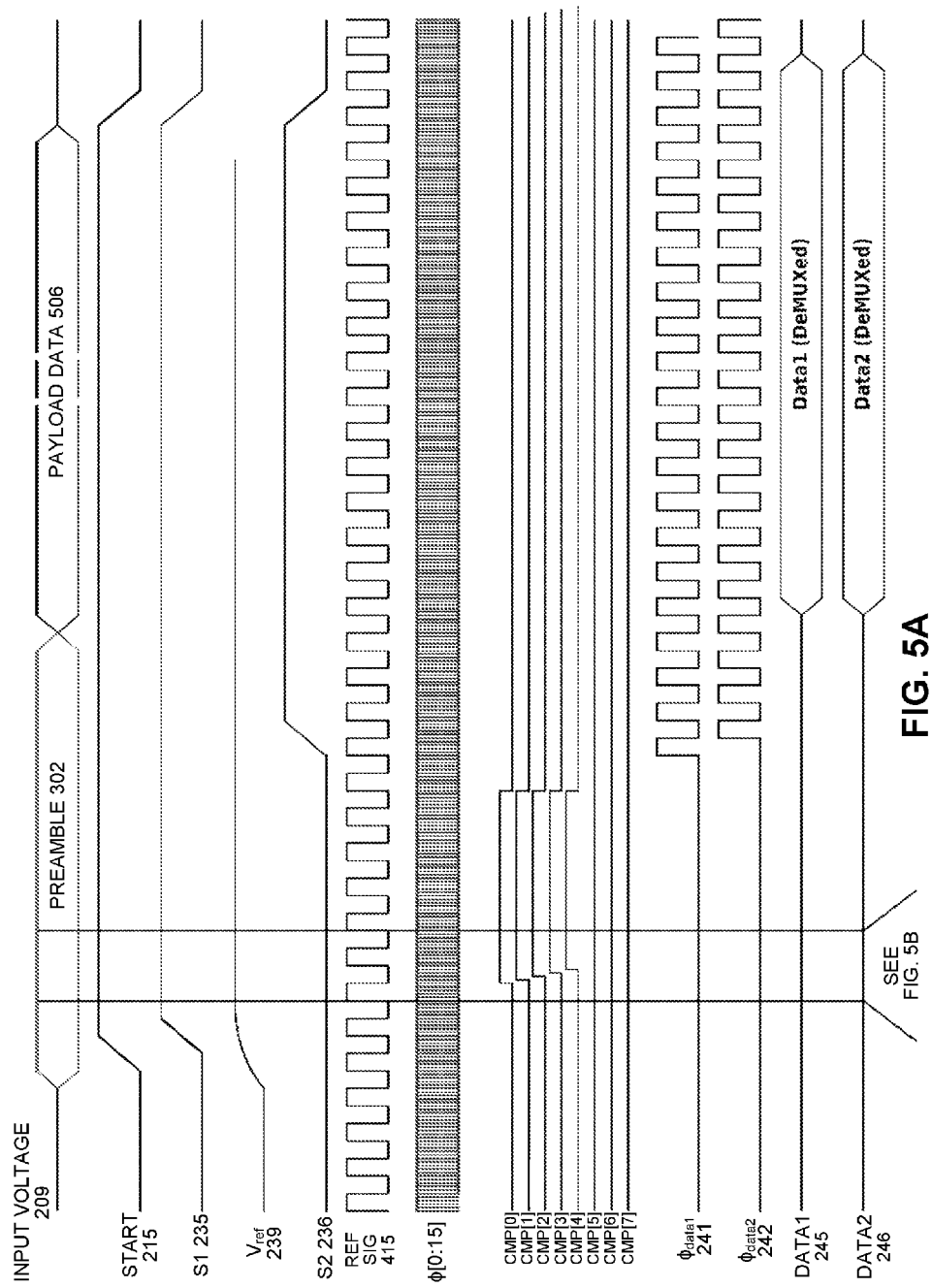
FIG. 5A presents a timing diagram for the burst-mode receiver illustrated in FIG. 2 in accordance with the disclosed embodiments.

FIG. 5A presents a timing diagram illustrating various signals, which are generated within optical receiver 200 illustrated in FIG. 2. The top signal in the timing diagram is input voltage signal 209 from input node 203. Note that input voltage signal 209 includes a preamble 302, which is initially transmitted to optical receiver 200 when data transmission starts and before subsequent transmission of payload data 506 commences. The next lower signal is start signal 215, which is generated by data-detection circuit 207, and which indicates whether data has been detected on input voltage signal 209. The next lower signal is control signal S1 235 for switch 222, which is generated by digital controller 230. The next lower signal is $V_{ref}$ 239, which is generated by reference-voltage-generation circuit 219. The next lower signal is control signal S2 236, which feeds into selection circuit 460 within clock-recovery circuit 240, and is also generated by digital controller 230. The next lower signal is the reference signal 415, which is produced by frequency synthesis PPL 410 in clock-recovery circuit 240. The next lower signal represents the set of equally spaced phases $\varphi[0:15]$, which are overlapped on the timing diagram. The next lower set of signals represents the corresponding outputs from comparators 440 in clock-recovery circuit 240. The next lower two signals are the complementary clock signals $\varphi_{data1}$ 241 and $\varphi_{data2}$ 242. Finally, the last two signals are the data output signals data1 245 and data2 246.

Figure 5B:
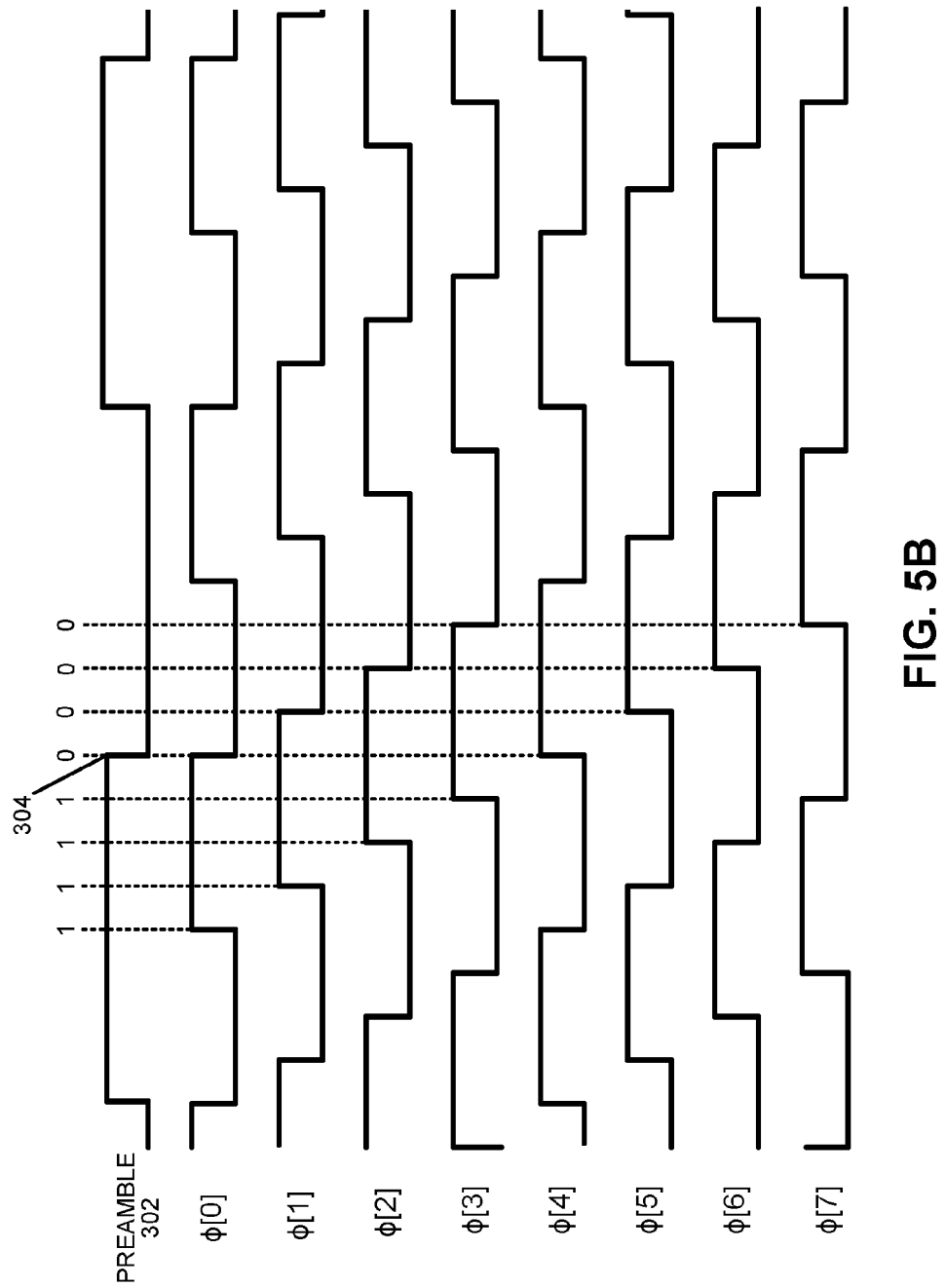
FIG. 5B presents a timing diagram illustrating how equally spaced phases can be used to sample a preamble in accordance with the disclosed embodiments.

FIG. 5B presents a timing diagram illustrating in more detail how half of the set of equally spaced phases $\varphi[0:7]$ can be used to sample a half cycle of the preamble 302. This sampling operation is used to detect a crossing point 304, which is used to select a phase to be used as a clock signal.

Operation of the Optical Receiver

Figures 6A, 6B:
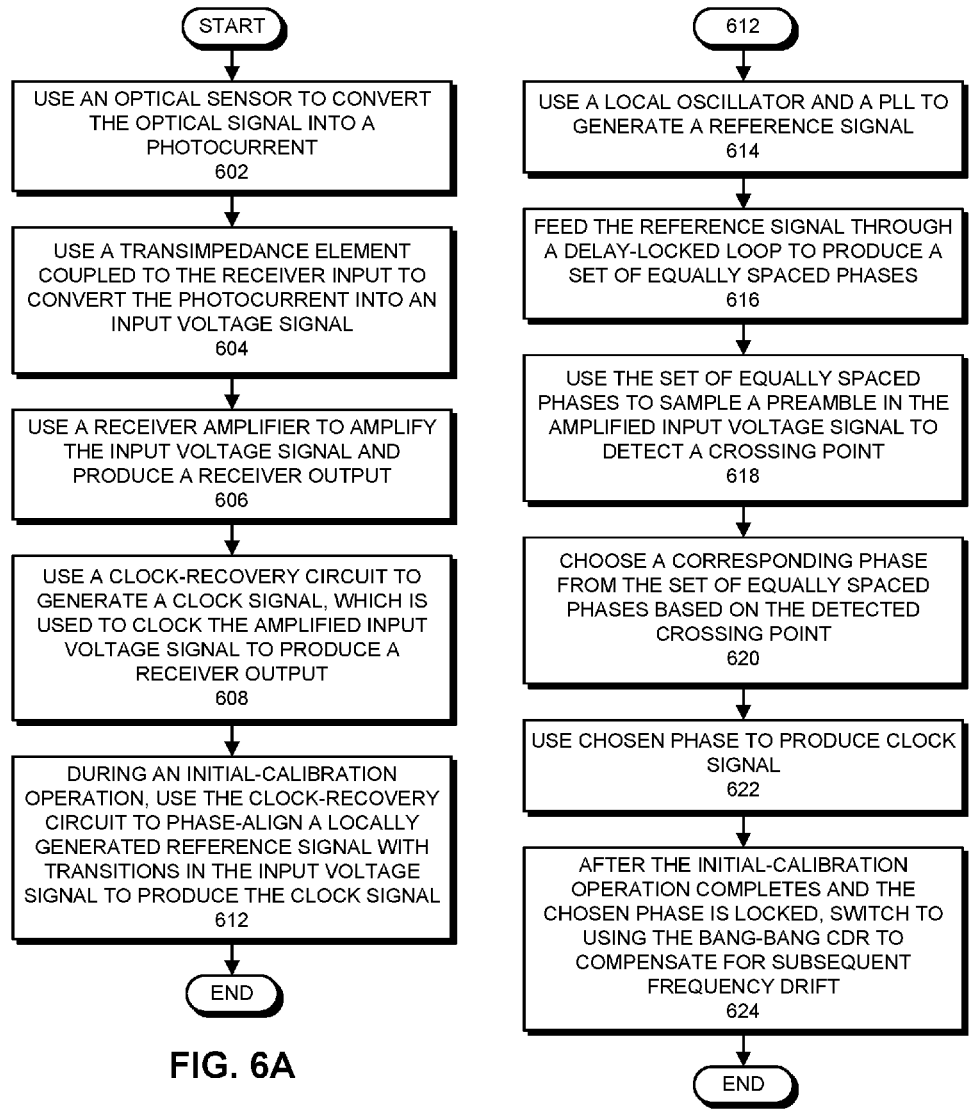
FIG. 6A presents a flowchart illustrating how the optical receiver operates in accordance with an embodiment of the present disclosure.
FIG. 6B presents a flowchart illustrating how the clock-recovery circuit phase-aligns the reference signal transitions in the input voltage signal in accordance with an embodiment of the present disclosure.

FIG. 6A presents a flowchart illustrating how a system comprising an optical receiver operates in accordance with an embodiment of the present disclosure. First, the system uses an optical sensor to convert the optical signal into a photocurrent (step 602). Next, the system uses a transimpedance element coupled to the receiver input to convert the photocurrent into an input voltage signal (step 604), and then uses a receiver amplifier to amplify the input voltage signal and produce a receiver output (step 606). The system also uses a clock-recovery circuit to generate a clock signal, which is used to clock the amplified input voltage signal to produce a receiver output (step 608). During an initial-calibration operation, the clock-recovery circuit phase-aligns a locally generated reference signal with transitions in the amplified input voltage signal to produce the clock signal (step 610).

FIG. 6B presents a flowchart illustrating in more detail how the clock-recovery circuit system phase-aligns the reference signal transitions in the input voltage signal in accordance with an embodiment of the present disclosure. First, the system uses a local oscillator and a PLL to generate a reference signal (step 614). Next, the system feeds the reference signal through a delay-locked loop (DLL) to produce a set of equally spaced phases (step 616). The system then uses the set of equally spaced phases to sample a preamble in the amplified input voltage signal to detect a crossing point (step 618). Next, the system chooses a corresponding phase from the set of equally spaced phases based on the detected crossing point (step 620). The system then uses the chosen phase to produce the clock signal (step 622). After the initial-calibration operation completes and the chosen phase is locked, the system switches to using the bang-bang CDR to compensate for subsequent frequency drift (step 624).

Note that the above-described low-overhead, burst-mode optical receiver makes it practical to implement new switching architectures. For example, the new optical receiver makes it possible to implement optical Ethernet switches, wherein the switching happens completely in the optical domain. (At the present moment, Ethernet switches operate in the electrical domain. This means that other components, such as quad small-form pluggable (QSFP) modules, need to be used to convert from the electrical domain to the optical domain, and then back from the electrical domain to the optical domain.)

System

Figure 7:
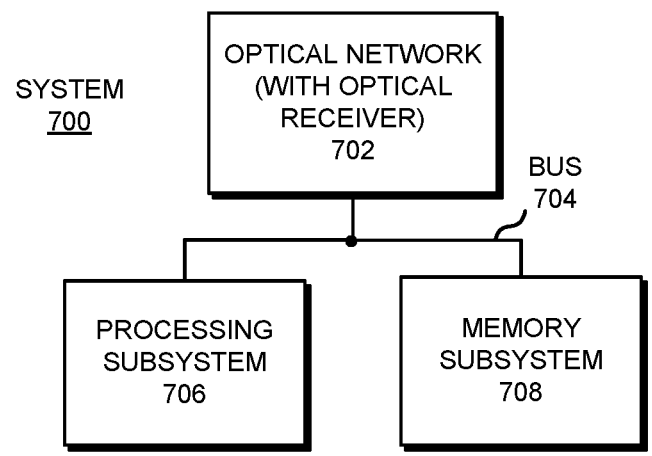
FIG. 7 illustrates a system that includes an optical receiver in accordance with an embodiment of the present disclosure.

One or more of the preceding embodiments of the optical receiver may be included in a system or device. More specifically, FIG. 7 illustrates a system 700 that includes an optical network 702, which includes an optical receiver. As illustrated in FIG. 7, system 700 also includes a processing subsystem 706 (comprising one or more processors) and a memory subsystem 708 (comprising memory).

In general, components within optical network 702 and system 700 may be implemented using a combination of hardware and/or software. Thus, system 700 may include one or more program modules or sets of instructions stored in a memory subsystem 708 (such as DRAM or another type of volatile or non-volatile computer-readable memory), which, during operation, may be executed by processing subsystem 706. Furthermore, instructions in the various modules in memory subsystem 708 may be implemented in: a high-level procedural language, an object-oriented programming language, and/or in an assembly or machine language. Note that the programming language may be compiled or interpreted, e.g., configurable or configured, to be executed by the processing subsystem.

Components in system 700 may be coupled by signal lines, links or buses, such as bus 704. These connections may include electrical, optical, or electro-optical communication of signals and/or data. Furthermore, in the preceding embodiments, some components are shown directly connected to one another, while others are shown connected via intermediate components. In each instance, the method of interconnection, or "coupling," establishes some desired communication between two or more circuit nodes, or terminals. Such coupling may often be accomplished using a number of photonic or circuit configurations, as will be understood by those of skill in the art; for example, photonic coupling, AC coupling and/or DC coupling may be used.

In some embodiments, functionality in these circuits, components and devices may be implemented in one or more: application-specific integrated circuits (ASICs), field-programmable gate arrays (FPGAs), and/or one or more digital signal processors (DSPs). Furthermore, functionality in the preceding embodiments may be implemented more in hardware and less in software, or less in hardware and more in software, as is known in the art. In general, system 700 may be at one location or may be distributed over multiple, geographically dispersed locations.

System 700 may include: a switch, a hub, a bridge, a router, a communication system (such as a wavelength-division-multiplexing communication system), a storage area network, a data center, a network (such as a local area network), and/or a computer system (such as a multiple-core processor computer system). Furthermore, the computer system may include, but is not limited to: a server (such as a multi-socket, multi-rack server), a laptop computer, a communication device or system, a personal computer, a work station, a mainframe computer, a blade, an enterprise computer, a data center, a tablet computer, a supercomputer, a network-attached-storage (NAS) system, a storage-area-network (SAN) system, a media player (such as an MP3 player), an appliance, a subnotebook/netbook, a tablet computer, a smartphone, a cellular telephone, a network appliance, a set-top box, a personal digital assistant (PDA), a toy, a controller, a digital signal processor, a game console, a device controller, a computational engine within an appliance, a consumer-electronic device, a portable computing device or a portable electronic device, a personal organizer, and/or another electronic device.

Moreover, optical network 702 can be used in a wide variety of applications, such as: communications (for example, in a transceiver, an optical interconnect or an optical link, such as for intra-chip or inter-chip communication), a radio-frequency filter, a biosensor, data storage (such as an optical-storage device or system), medicine (such as a diagnostic technique or surgery), a barcode scanner, metrology (such as precision measurements of distance), manufacturing (cutting or welding), a lithographic process, data storage (such as an optical-storage device or system) and/or entertainment (a laser light show).

Various modifications to the disclosed embodiments will be readily apparent to those skilled in the art, and the general principles defined herein may be applied to other embodiments and applications without departing from the spirit and scope of the present invention. Thus, the present invention is not limited to the embodiments shown, but is to be accorded the widest scope consistent with the principles and features disclosed herein.

The foregoing descriptions of embodiments have been presented for purposes of illustration and description only. They are not intended to be exhaustive or to limit the present description to the forms disclosed. Accordingly, many modifications and variations will be apparent to practitioners skilled in the art. Additionally, the above disclosure is not intended to limit the present description. The scope of the present description is defined by the appended claims.

What is claimed is:

1. An optical receiver, comprising:
   a receiver input that receives a photocurrent from a photosensor;
   a transimpedance element coupled to the receiver input, which converts the photocurrent into an input voltage signal;
   a receiver amplifier that amplifies the input voltage signal; and
   a clock-recovery circuit that generates a clock signal, which is used to clock the amplified input voltage signal to produce a receiver output;
   wherein during an initial-calibration operation, the clock-recovery circuit phase-aligns a locally generated reference signal with transitions in the amplified input voltage signal to produce the clock signal by performing the following operations,
   feeding the reference signal through a delay-locked loop (DLL) to produce a set of equally spaced phases,
   using the set of equally spaced phases to sample a preamble in the amplified input voltage signal to detect a crossing point,
   choosing a corresponding phase from the set of equally spaced phases based on the detected crossing point, and
   using the chosen phase to produce the clock signal.

2. The optical receiver of claim 1, further comprising a reference-signal-generation circuit that generates the reference signal, wherein the reference-signal-generation circuit comprises:
   a local oscillator that generates a reference frequency; and
   a phase-locked loop (PLL) that uses the reference frequency to generate the reference signal.

3. The optical receiver of claim 2, wherein the clock-recovery circuit additionally includes a bang-bang clock-and-data-recovery (CDR) circuit, wherein after the initial-calibration operation completes and the chosen phase is locked, the clock-recovery circuit switches to using the bang-bang CDR to compensate for subsequent frequency drift.

4. The optical receiver of claim 3, wherein the bang-bang CDR circuit shares a charge pump, a loop filter and a capacitor with the PLL.

5. The optical receiver of claim 1,
   wherein the preamble comprises a periodic signal that cycles between high and low signal levels; and
   wherein while sampling the preamble, the clock-recovery circuit uses the set of equally spaced phases to sample half a cycle of the preamble to detect the crossing point.

6. The optical receiver of claim 1, wherein the clock signal comprises a pair of complementary clock signals, which are used to clock a corresponding pair of sense amplifiers, which sample the amplified input voltage signal on alternating clock edges, so that data is gathered at twice the frequency of the clock signal.

7. The optical receiver of claim 1, wherein the DLL includes a voltage-controlled variable delay line comprising a chain of delay elements that generates the set of equally spaced phases.

8. The optical receiver of claim 7, further comprising a set of comparators that receive the amplified input voltage signal, wherein while sampling the preamble, the set of comparators is clocked by the set of equally spaced phases.

9. The optical receiver of claim 1, wherein the transimpedance element comprises one of:
   a resistor; and
   a transimpedance amplifier (TIA).

10. The optical receiver of claim 1, wherein the photosensor comprises a photodiode that converts an optical signal into the photocurrent.

11. A system, comprising:
    at least one processor;
    at least one memory coupled to the at least one processor; and
    an optical receiver that facilitates communication of optical signals within the system, wherein the optical receiver includes:

a receiver input that receives a photocurrent from a photosensor;

a transimpedance element coupled to the receiver input, which converts the photocurrent into an input voltage signal;

a receiver amplifier that amplifies the input voltage signal; and a clock-recovery circuit that generates a clock signal, which is used to clock the amplified input voltage signal to produce a receiver output;

wherein during an initial-calibration operation, the clock-recovery circuit phase-aligns a locally generated reference signal with transitions in the amplified input voltage signal to produce the clock signal by performing the following operations, feeding the reference signal through a delay-locked loop (DLL) to produce a set of equally spaced phases, using the set of equally spaced phases to sample a preamble in the amplified input voltage signal to detect a crossing point, choosing a corresponding phase from the set of equally spaced phases based on the detected crossing point, and using the chosen phase to produce the clock signal.

12. The system of claim 11, further comprising a reference-signal-generation circuit that generates the reference signal, wherein the reference-signal-generation circuit comprises:

a local oscillator that generates a reference frequency; and a phase-locked loop (PLL) that uses the reference frequency to generate the reference signal.

13. The system of claim 12, wherein the clock-recovery circuit additionally includes a bang-bang clock-and-data-recovery (CDR) circuit, wherein after the initial-calibration operation completes and the chosen phase is locked, the clock-recovery circuit switches to using the bang-bang CDR to compensate for subsequent frequency drift.

14. The system of claim 13, wherein the bang-bang CDR circuit shares a charge pump, a loop filter and a capacitor with the PLL.

15. The system of claim 11, wherein the preamble comprises a periodic signal that cycles between high and low signal levels; and wherein while sampling the preamble, the clock-recovery circuit uses the set of equally spaced phases to sample half a cycle of the preamble to detect the crossing point.

16. The system of claim 11, wherein the clock signal comprises a pair of complementary clock signals, which are used to clock a corresponding pair of sense amplifiers, which sample the amplified input voltage signal on alternating clock edges, so that data is gathered at twice the frequency of the clock signal.

17. The system of claim 11, wherein the DLL includes a voltage-controlled variable delay line comprising a chain of delay elements that generates the set of equally spaced phases.

18. The system of claim 17, further comprising a set of comparators that receive the amplified input voltage signal, wherein while sampling the preamble, the set of comparators is clocked by the set of equally spaced phases.

19. A method for receiving an optical signal, comprising:

using an optical sensor to convert the optical signal into a photocurrent;

using a transimpedance element coupled to the receiver input to convert the photocurrent into an input voltage signal;

using a receiver amplifier to amplify the input voltage signal and produce a receiver output; and using a clock-recovery circuit to generate a clock signal, which is used to clock the amplified input voltage signal to produce a receiver output;

wherein during an initial-calibration operation, the clock-recovery circuit phase-aligns a locally generated reference signal with transitions in the amplified input voltage signal to produce the clock signal by performing the following operations, feeding the reference signal through a delay-locked loop (DLL) to produce a set of equally spaced phases, using the set of equally spaced phases to sample a preamble in the amplified input voltage signal to detect a crossing point, choosing a corresponding phase from the set of equally spaced phases based on the detected crossing point, and using the chosen phase to produce the clock signal.

20. The method of claim 19, wherein the clock-recovery circuit additionally includes a bang-bang clock-and-data-recovery (CDR) circuit; and wherein after the initial-calibration operation completes and the chosen phase is locked, the method further comprises switching the clock recovery circuit to using the bang-bang CDR to compensate for subsequent frequency drift.

\* \* \* \* \*

UNITED STATES PATENT AND TRADEMARK OFFICE
CERTIFICATE OF CORRECTION

PATENT NO. : 9,935,719 B1  
APPLICATION NO. : 15/462306  
DATED : April 3, 2018  
INVENTOR(S) : Saeedi et al.

Page 1 of 1

It is certified that error appears in the above-identified patent and that said Letters Patent is hereby corrected as shown below:

In the Specification

In Column 5, Line 23, delete "$V_{ref}239.$" and insert -- $V_{ref}\ 239.$ --, therefor.

In Column 5, Line 40, delete "$\varphi_{data2}242.$" and insert -- $\varphi_{data2}\ 242.$ --, therefor.

Signed and Sealed this  
Twenty-eighth Day of August, 2018

Andrei Iancu  
*Director of the United States Patent and Trademark Office*